US007326945B2

(12) United States Patent  
Goldstein

(10) Patent No.: US 7,326,945 B2  
(45) Date of Patent: Feb. 5, 2008

(54) DOSE TRANSFER STANDARD DETECTOR FOR A LITHOGRAPHY TOOL

(75) Inventor: Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 797 days.

(21) Appl. No.: 10/661,971

(22) Filed: Sep. 11, 2003

(65) Prior Publication Data

US 2005/0057739 A1    Mar. 17, 2005

(51) Int. Cl.
*G01N 21/86* (2006.01)
*G03B 27/72* (2006.01)

(52) U.S. Cl. .......................................... 250/548; 355/69
(58) Field of Classification Search ................ 250/548; 355/69

See application file for complete search history.

(56) References Cited

U.S. PATENT DOCUMENTS

| | | | | |
|---|---|---|---|---|
| 4,000,502 A | * | 12/1976 | Butler et al. ................ 257/453 |
| 4,585,342 A | * | 4/1986 | Lin et al. ..................... 356/124 |
| 5,321,269 A | * | 6/1994 | Kitaguchi et al. ..... 250/370.05 |
| 6,486,476 B1 | * | 11/2002 | Ochiai et al. .......... 250/370.01 |
| 2002/0102482 A1 | * | 8/2002 | Smith et al. ................... 430/22 |
| 2002/0134947 A1 | * | 9/2002 | Van Schaik .............. 250/492.1 |
| 2003/0074097 A1 | * | 4/2003 | Mautz et al. ................ 700/121 |
| 2004/0058256 A1 | * | 3/2004 | Fujisawa et al. .............. 430/30 |

* cited by examiner

*Primary Examiner*—Georgia Epps
*Assistant Examiner*—Kevin Wyatt
(74) *Attorney, Agent, or Firm*—Fish & Richardson P.C.

(57) ABSTRACT

A dose transfer standard detector measures radiation intensity and dose in a lithography tool. The lithography tool may be an Extreme Ultraviolet lithography (EUVL) tool. The dose transfer standard detector may transmit intensity and dose data to a computer, which analyzes the data. Based on the analyzed data, the lithography tool may be calibrated.

8 Claims, 3 Drawing Sheets

DOSE TRANSFER STANDARD DETECTOR FOR A LITHOGRAPHY TOOL

BACKGROUND

A microchip manufacturing process may deposit various material layers on a wafer and form a photosensitive film or photoresist on one or more deposited layers. A lithography tool may transmit light through transmissive optics or reflect light from reflective optics to a reticle or patterned mask. Light from the reticle transfers a patterned image onto the photoresist. Portions of the photoresist which are exposed to light may be removed. Portions of the wafer which are not protected by the remaining photoresist may be etched to form transistor features.

The semiconductor industry may continue to reduce the size of transistor features to increase transistor density and improve transistor performance. This reduction in transistor feature size has driven a reduction in the wavelength of light used in lithography tools to define smaller transistor features on a photoresist.

DETAILED DESCRIPTION

Extreme Ultraviolet lithography (EUVL) may use a radiation wavelength of approximately 11-15 nanometers (nm). An EUV lithography tool may print a pattern on a photoresist with dimensions which are smaller than dimensions achieved by other lithography tools. An EUV lithography tool may also be called a "lithographic exposure system," an "EUV scanner" or an "EUV stepper."

Figure 1:
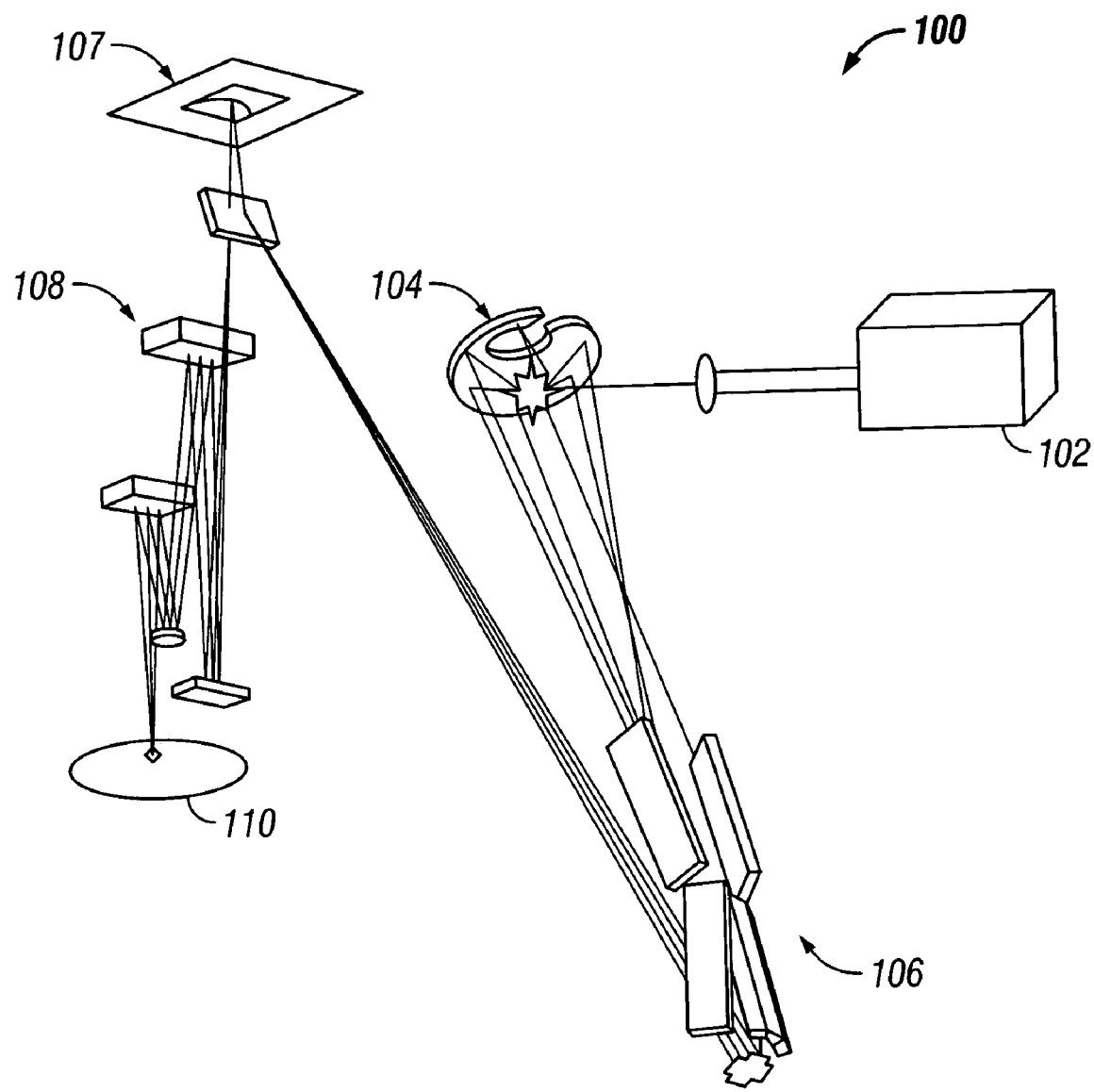
FIG. 1 illustrates an example of a lithography tool, such as an Extreme Ultraviolet lithography (EUVL) tool.

FIG. 1 illustrates an example of a lithography tool 100, such as an Extreme Ultraviolet lithography (EUVL) tool. The lithography tool 100 may include a laser 102, an electric discharge or laser produced plasma source 104, condenser optics 106, a reflective reticle 107 with a pattern, and reflective reduction optics 108. The reticle 107 may be used to form a patterned image on an object 110, such as a silicon wafer with a photoresist layer.

"Intensity" (milliWatts/cm$^2$) refers to an amount of radiation incident upon the object 110 in the lithography tool 100. "Dose" (milliJoules/cm$^2$) refers to an amount of energy absorbed by the object 110 in the lithography tool 100. A user may set radiation intensity and dose for a lithography tool according to a standard reference. The standard reference may be based on values provided by the National Institute of Standards & Technology (NIST). The intensity and dose may vary slightly from lithography tool to lithography tool even though the lithography tools have the same settings. Intensity and dose may also change ("drift") after a lithography tool is shipped or after repeated used.

It may be desirable to measure and calibrate the intensity and dose of a lithography tool. It may be desirable to compare and match the intensity and dose of two or more lithography tools.

It may be difficult to access a wafer stage of a conventional lithography tool to install hardware to measure radiation intensity and dose. A lithography tool may have a vacuum or non-vacuum wafer stage. For a lithography tool with a non-vacuum wafer stage, a person may enter the lithography tool and manually connect radiation detection hardware to the wafer stage.

For a lithography tool with a wafer stage in a vacuum, such as an EUV lithography tool, a person may have to break the vacuum to install radiation detection hardware to the wafer stage. Alternatively, a robot may be inserted in an interlock chamber connected to the vacuum to insert radiation detection hardware to the wafer stage.

The present application relates to a dose transfer (or dose transport) standard detector and techniques of using the same. The detector may address the challenges of moving a dose detector between two or more lithography tools. The detector may be easily loaded and unloaded on a wafer stage of a lithography tool, such as an extreme ultraviolet lithography (EUVL) tool. The detector may accurately measure the intensity and/or dose of one or more vacuum or non-vacuum lithography tools. The size, shape and components of the detector may automate loading of the detector, alignment of the detector, and collection of intensity and dose data. A computer may compare data from the detector with a reference value.

Figure 2:
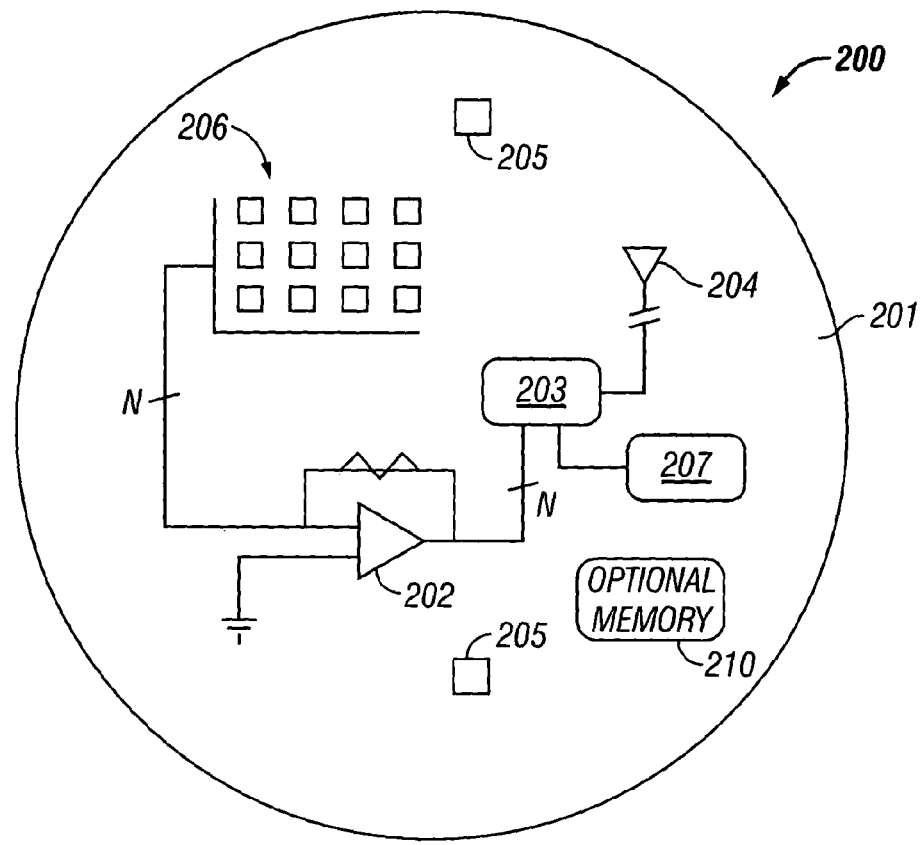
FIG. 2 illustrates a dose transfer standard detector structure which may be used in the lithography tool of FIG. 1.

FIG. 2 illustrates a dose transfer standard detector structure 200, which may be used in the lithography tool 100 of FIG. 1. Lithography tools may handle the dose transfer standard detector structure 200 as any other wafer. The detector structure 200 may include a wafer 201 fabricated with an array of detectors 206, one or more amplifiers 202, a processor 203, a wireless transmitter 204, a power source 207 and alignment marks 205.

The processor 203 in FIG. 2 may be a digital signal processor available from Intel Corporation. The power source 207 in FIG. 2 may be capacitive, electrolytic, photovoltaic or some other type of power source. The alignment marks 205 allow the wafer 201 to be aligned on a wafer stage of the lithography tool 100.

The detectors 206 in FIG. 2 may be adapted to detect radiation intensity (milliWatts/cm$^2$) incident upon the wafer 201 and/or dose (milliJoules/cm$^2$) when the wafer 201 is in the lithography tool 100. The detectors 206 may include photodiodes. For example, the detectors 206 may include a silicon photodiode. The detectors 206 may detect extreme ultraviolet (EUV) radiation and other types of radiation. An array of detectors 206 may be used since intensity and/or dose may vary (e.g., 0.5%) over multiple detectors. An average intensity and/or dose over multiple detectors may be calculated in an embodiment.

The temperature of the wafer stage inside the lithography tool 100 may be carefully controlled such that the detectors 206, amplifiers 202, processor 203, wireless transmitter 204, and power source 207 on the wafer 201 do not experience a substantial temperature change. The array of detectors 206 may be the only components on the wafer 201 exposed to radiation in the lithography tool 100 in an embodiment.

Figure 3:
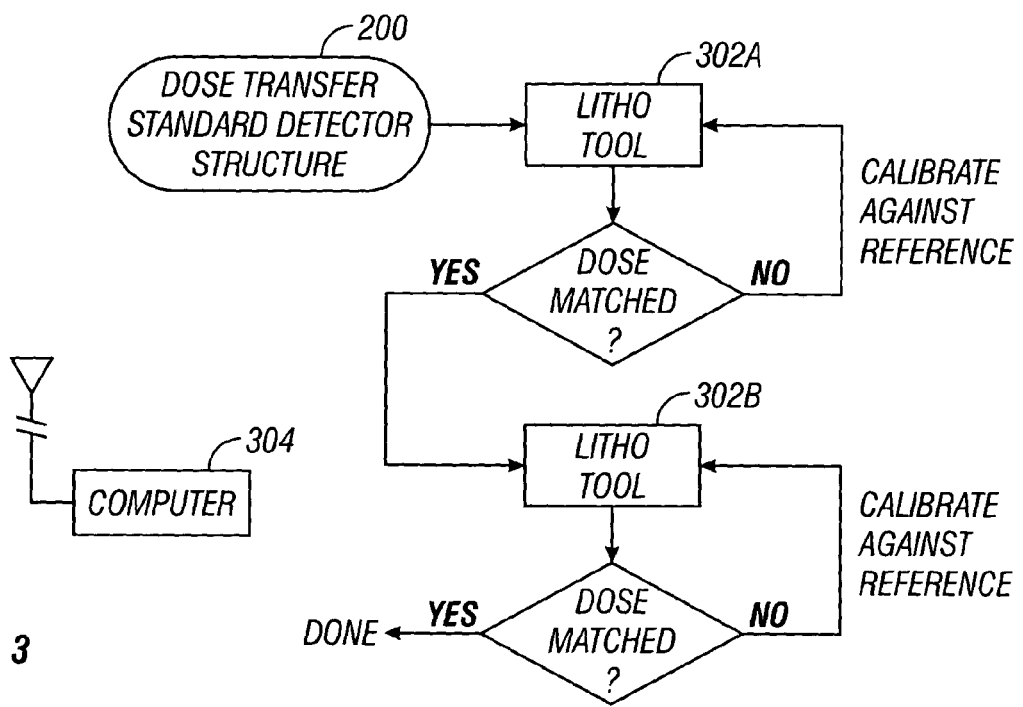
FIG. 3 illustrates the dose transfer standard detector structure of FIG. 2, two lithography tools and a computer.

FIG. 3 illustrates the dose transfer standard detector structure 200 of FIG. 2 being used with first and second lithography tools 302A, 302B and a computer 304. The lithography tools 302A, 302B may be similar to the lithography tool 100 of FIG. 1.

Figure 4:
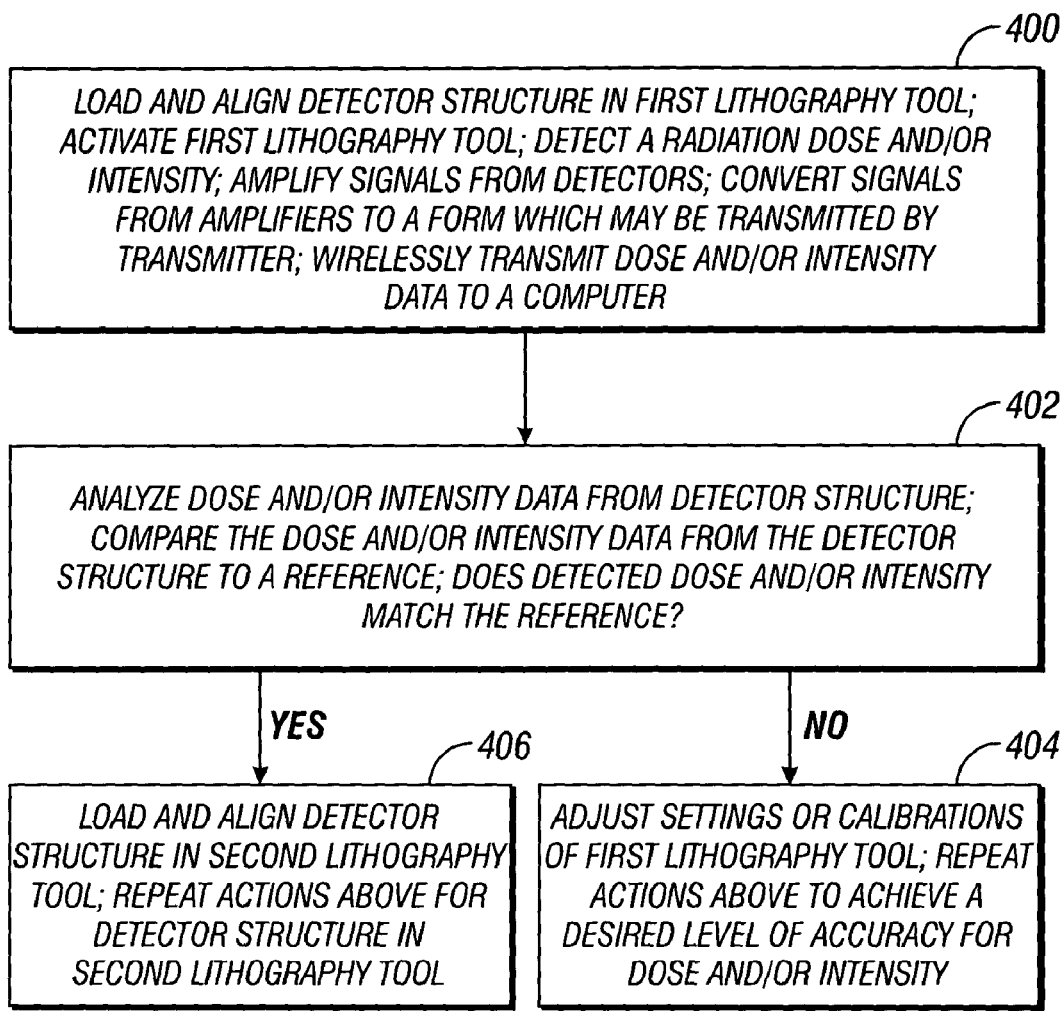
FIG. 4 shows a flow chart of using the dose transfer standard detector of FIG. 2.

FIG. 4 shows a flow chart for using the dose transfer standard detector structure 200 of FIG. 2. The detector structure 200 may be loaded and aligned on a wafer stage of the first lithography tool 302A (FIG. 3) at 400 in FIG. 4. The first lithography tool 302A may be activated to produce radiation on the detectors 206 of the wafer 201. The array of detectors 206 may detect a radiation dose and/or intensity and produce one or more signals. One or more amplifiers 202 may amplify signals from the detectors 206. The processor 203 may process or convert amplified signals from the amplifiers 202 to a form which may be transmitted by the transmitter 204. The transmitter 204 may wirelessly transmit signals corresponding to dose and/or intensity data to the computer 304 (FIG. 3) while the detector structure 200 is inside the first lithography tool 302A.

In alternative embodiment, the detector structure 200 stores dose and/or intensity data in an optional memory 210. When the detector structure 200 comes out of the first lithography tool 302A, the detector structure 200 may transfer dose and/or intensity data in the memory 210 to the computer 304 wirelessly or via a physical output connector.

The computer 304 may analyze the dose and/or intensity data from the detector structure 200 at 402. The computer 304 may collect and analyze data remotely. The computer 304, or a user using data from the computer 302, may compare the dose and/or intensity data from the detector structure 200 to a reference, such as a user-defined setting on the first lithography tool 302A. The computer 304 or a user may determine if the detected dose and/or intensity substantially matches the reference.

If the computer 304, or a user using the computer 302, determines that the detected dose and/or intensity does not substantially match the reference, the computer 304 or user may adjust settings or calibrations of the first lithography tool 302A at 404. For example, the first lithography tool 302A may be set to produce a desired dose of 10 milliJoules/cm$^2$ (e.g., by calibrating the laser 102 in FIG. 1). But the detector structure 200 loaded in the first lithography tool 302A detects an actual dose of 9.5 milliJoules/cm$^2$. The computer 304, or a user using the computer 302, may adjust the first lithography tool 302A to 10.5 milliJoules/cm$^2$. The first lithography tool 302A may then produce an actual dose of 10 milliJoules/cm$^2$.

The actions described above at 400 through 404 may be repeated to achieve a desired level of accuracy for dose and/or intensity of the first lithography tool 302A.

If the computer 304, or a user using the computer 302, determines that the detected dose and/or intensity does substantially match the reference, the dose transfer standard detector structure 200 may be loaded and aligned on a wafer stage of the second lithography tool 302B at 406. The detector structure 200 may measure dose and/or intensity of the second lithography tool 302B. The computer 304 or a user may adjust the second lithography tool's calibration based on the measured dose and/or intensity. The actions described above at 400-404 may be repeated for the second lithography tool 302B and other lithography tools.

Thus, the detector structure 200 and computer 304 may be used to calibrate two or more lithography tools. The detector structure 200 and computer 304 may be used to match intensity and dose of two or more lithography tools.

Figure 5:
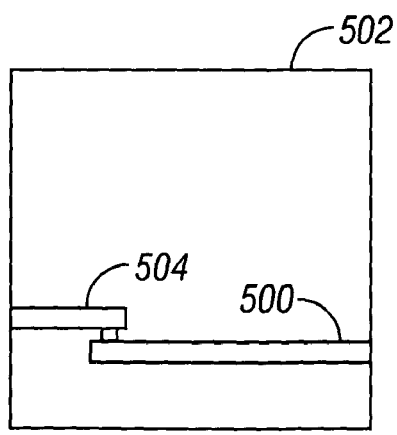
FIG. 5 illustrates an alternative embodiment of the dose transfer standard detector structure of FIG. 2.

FIG. 5 illustrates an alternative embodiment of a dose transfer standard detector structure 500. The detector structure 500 may have detectors, amplifiers and alignment marks which are substantially similar to the detectors 206, amplifiers 202 and alignment marks 205 of the detector structure 200 in FIG. 2. The detector structure 500 may be inserted in a lithography tool 502. The lithography tool 502 may have sensors or probes 504 which contact the detector structure 500 to establish an electrical connection and read intensity and/or dose data from the detector structure 500.

A number of embodiments have been described. Nevertheless, it will be understood that various modifications may be made without departing from the spirit and scope of the application. For example, the structures and techniques described above may be used to measure and calibrate intensity and does for other lithography tools besides EUV lithography tools. Accordingly, other embodiments are within the scope of the following claims.

What is claimed is:

1. A system comprising:
   a processor; and
   a radiation detector adapted to communicate with the processor, the radiation detector dimensioned to fit on a wafer stage of a lithography tool, the radiation detector comprising
   a detector element to detect an amount of radiation incident on the detector element, and
   a memory to store data describing the amount of radiation detected.

2. The system of claim 1, wherein:
   the processor is adapted to compare the amount of radiation detected to a reference; and
   the processor further comprises an output to output a signal for calibrating the lithography tool.

3. The system of claim 1, wherein the radiation detector further comprises a wireless data transmitter to wirelessly transmit the data to the processor.

4. An apparatus comprising:
   a wafer sized to fit on a wafer stage of a lithography tool, the wafer comprising:
   a radiation detector to produce a signal describing an amount of radiation incident on the radiation detector;
   a processor electrically coupled to the radiation detector, the processor to process the signal from the radiation detector; and
   a memory electrically coupled to the processor, the memory to store data received from the processor, the data resulting from the processing of the signal describing the amount of radiation incident on the detector.

5. The apparatus of claim 4, wherein the wafer further comprises an output connector adapted to output data from the memory.

6. The apparatus of claim 4, wherein the wafer further comprises a wireless transmitter coupled to the memory to wirelessly output the data from the memory.

7. The system of claim 1, wherein the radiation detector comprises a wafer-shaped radiation detector.

8. The system of claim 1, further comprising an extreme ultraviolet lithography tool, wherein the radiation detector is dimensioned to fit on the wafer stage of the extreme ultraviolet lithography tool.

* * * * *